United States Patent
Bruneau et al.

(10) Patent No.: US 6,469,572 B1
(45) Date of Patent: Oct. 22, 2002

(54) FORWARD BODY BIAS GENERATION CIRCUITS BASED ON DIODE CLAMPS

(75) Inventors: David W. Bruneau, Milwaukie; Siva G. Narendra; Vivek K. De, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/821,531

(22) Filed: Mar. 28, 2001

(51) Int. Cl.[7] .............................. G05F 3/24; G05F 3/26
(52) U.S. Cl. ........................................ 327/537; 327/541
(58) Field of Search ................................ 327/534, 535, 327/537, 540, 541, 309, 543; 323/313, 315, 316, 289, 901

(56) References Cited

U.S. PATENT DOCUMENTS

| | | | | |
|---|---|---|---|---|
| 5,448,159 A | * | 9/1995 | Kojima et al. ............... | 323/315 |
| 5,461,338 A | * | 10/1995 | Hirayama et al. ........... | 327/534 |
| 5,614,816 A | * | 3/1997 | Nahas ......................... | 323/316 |
| 6,052,020 A | | 4/2000 | Doyle ......................... | 327/539 |
| 6,184,745 B1 | * | 2/2001 | Kim ............................ | 327/541 |
| 6,300,819 B1 | * | 10/2001 | De et al. ..................... | 327/537 |

* cited by examiner

Primary Examiner—Timothy P. Callahan
Assistant Examiner—Terry L. Englund
(74) Attorney, Agent, or Firm—Blakley, Sokoloff, Taylor & Zafman LLP (57) ABSTRACT

Various embodiments of a method for providing forward body bias (FBB) are disclosed. A first diode element is forward biased to a first voltage. A voltage proportional to the first diode voltage is converted into a current. A current is mirrored through a second diode element to generate a second diode voltage. A constant FBB based upon the second diode voltage is generated and applied to the bulk terminal of a field effect transistor (FET) of an integrated circuit die.

32 Claims, 5 Drawing Sheets

FORWARD BIAS A FIRST DIODE ELEMENT TO
A FIRST DIODE VOLTAGE
304

CONVERT A VOLTAGE PROPORTIONAL TO
THE FIRST DIODE VOLTAGE INTO A CURRENT
308

MIRROR THE CURRENT THROUGH A SECOND
DIODE ELEMENT TO GENERATE A SECOND
DIODE VOLTAGE
312

GENERATE A CONSTANT FBB BASED ON THE SECOND
DIODE VOLTAGE AND APPLY THE FBB TO EACH BULK
TERMINAL OF AT LEAST SOME FETs IN A FUB OF AN
IC die
316

FORWARD BODY BIAS GENERATION CIRCUITS BASED ON DIODE CLAMPS

BACKGROUND

This invention is generally related to the generation of a forward body bias (FBB) voltage for field effect transistors (FETs), and particularly to robust generation circuits that maintain a constant FBB despite variations in the manufacturing process, the operating temperature, and supply voltage.

Forward body biasing reduces process induced variations in short channel field effect transistors (FETs). N-channel FETs (NFETs) have sources, drains, and bodies (also known as bulks) with voltages Vsource, Vdrain, and Vbody. N-channel metal oxide semiconductor field effect transistors (NMOSFETs) are examples of NFETs. NFETs are zero body biased when Vbody=Vsource, reverse body biased when Vbody<Vsource, and forward body biased when Vbody>Vsource. The amount of FBB for NFETs is measured by Vbody−Vsource, which equals Vbody when Vsource is at ground on a return line voltage (sometimes referred to as Vss). P-channel FETs (PFETs) have sources, drains, and bodies with voltages Vsource, Vdrain, and Vbody. P-channel metal oxide semiconductor field effect transistors (PMOSFETs) are examples of PFETs. PFETs are zero body biased when Vbody=Vsource, reverse body biased when Vbody>Vsource, and forward body biased when Vbody<Vsource. The amount of FBB for PFETs is measured by Vsource−Vbody, which equals Vcc−Vbody in cases where Vsource is at the power supply line voltage Vcc (sometimes referred to as Vdd).

The threshold voltage (Vt) of a FET decreases as the FET becomes more forward biased and increases as the FET becomes less forward biased or more reverse biased. The leakage of a FET increases as the FET becomes more forward biased and decreases as the FET becomes less forward biased or more reverse biased.

Circuits that provide stable voltage references independent of manufacturing process, power supply voltage and operating temperature are needed for many applications, including accurate FBB generation. In applications such as FBB generation in CMOS ICs, a complimentary pair of FBB reference voltages often needs to be provided, where one is measured with respect to the power supply voltage (e.g. Vdd or Vcc) and the other is measured with respect to the power return voltage (Vss or ground). The voltage with respect to Vdd, called Vrefc, is applied to a PFET whereas the voltage with respect to Vss, called Vrefs, is applied to an NFET. Thus, for a PFET whose source is shorted to Vdd, a FBB of approximately 0.4 Volts is obtained by setting the bulk terminal of the device to Vrefc which is 0.4 Volts less than Vdd. In the same way, for an NFET whose source is shorted to Vss, the FBB of 0.4 Volts is applied by setting the bulk terminal to Vrefs which is 0.4 Volts greater than Vss.

Among the techniques available for realizing a voltage reference are the use of zener diodes, the use of the difference in threshold voltage between enhancement and depletion FETs, and bandgap-based circuits. The first two methods are not suitable for complex, advanced integrated circuits (ICs) because the breakdown voltage of the zener diode is significantly higher than the supply voltages used to operate such ICs. Depletion FETs may not be available in complimentary metal oxide semiconductor (CMOS) IC fabrication processes. Because of these limitations, bandgap circuits are used extensively. Although bandgap reference circuits are extremely accurate, they are complex and demand considerable design time.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

The embodiments of the central bias generator described below take advantage of the exponential current voltage (I–V) characteristic of the p-n junction diode. When the diode is forward biased, also said to be conducting in the forward direction or "turned on", the diode voltage across its terminals may be clamped to essentially any voltage of choice, by biasing, in this case sinking or sourcing, an approximate current through the diode. Although variation in the bias current and operating temperature do affect the diode voltage, measurements show that the diode voltage varies only by approximately +/−14% with five times variation in bias current, across an operating temperature ranging from 0 to 110 degrees centigrade. Thus, while the diode voltage may not be as accurate as a bandgap reference, the variation in the diode voltage appears to be within tolerable limits for its use as a forward body bias generator. Several embodiments of a central bias generator that incorporate a forward biased diode, to obtain a FBB voltage, are described below.

Figure 1:
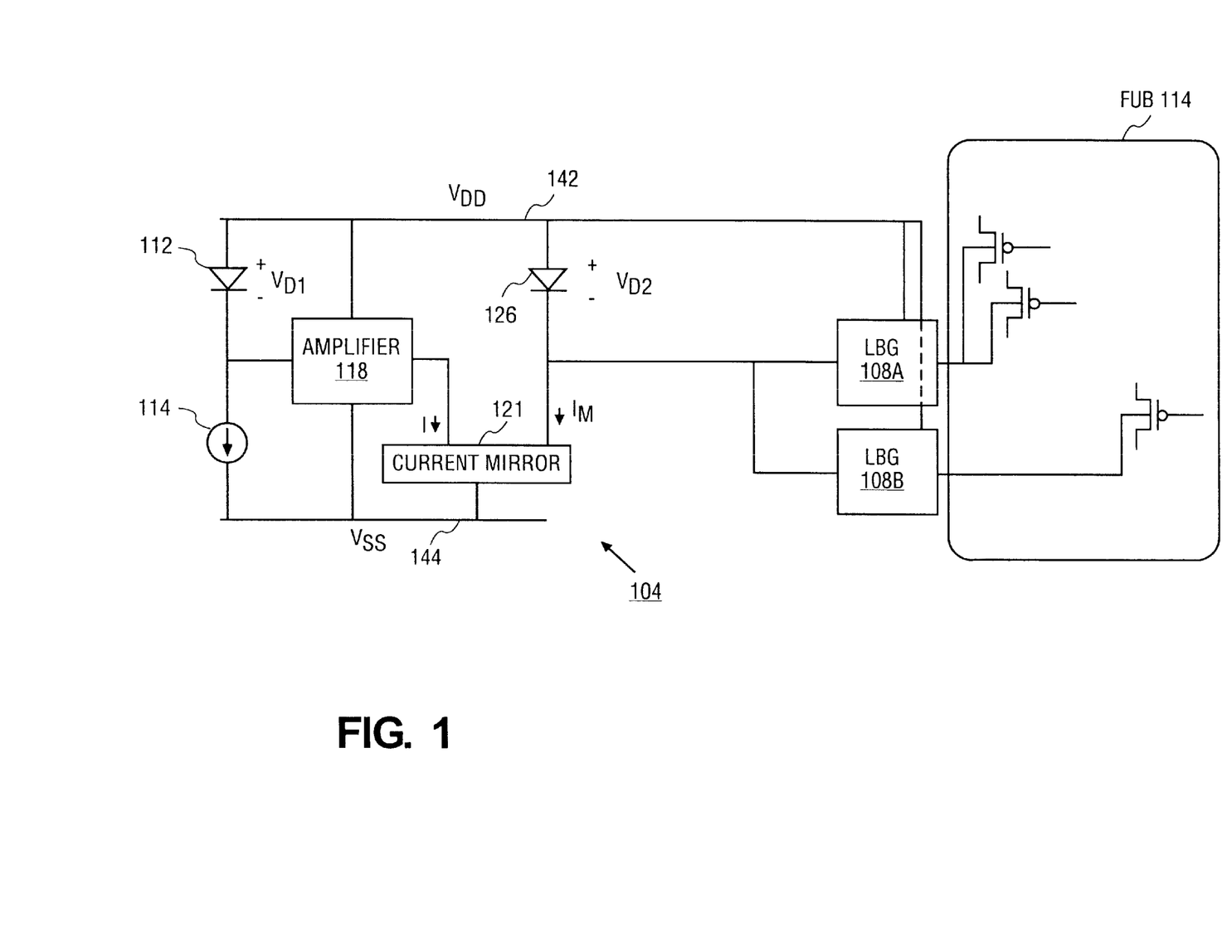
FIG. 1 shows a block diagram of a central bias generator according to an embodiment of the invention.

Referring first to FIG. 1, an electrical system featuring a central bias generator (CBG) 104 according to some embodiments of the invention is shown in block diagram form. The term "central" is used here only in the sense that an output of the central bias generator may be essentially distributed to provide FBB, via one or more "local" bias generators (LBGs) 108a and 108b, to a number of FETs in a functional unit block (FUB) 114. The CBG 104 features a diode element 112 that defines a diode voltage Vd across its terminals. This diode element is forward biased using a current sink 114 that is connected in series with the diode element 112. In some embodiments, the current sink 114 should be designed to provide an approximate current that does not vary by more than 3 to 5 times across process, supply voltage, and operating temperature variations. The anode terminal of the diode element 112 is shorted to a power supply line 142 (labeled Vdd) whereas the current sink 114 has its lower terminal shorted to a power return line 144 (labeled Vss). An amplifier 118 has an input coupled to receive the diode voltage Vd and an output coupled to feed a current mirror 121. The current mirror is coupled to sink a mirrored current Im through a second diode element 126 to generate a second diode voltage Vd2. The second diode voltage is fed, either directly or through a buffer for greater fanout, to a number of local bias generators (LBGs) 108a and 108b which provide a constant FBB to each bulk terminal of at least some of the FETs in the FUB 114.

A FUB is any group of circuitry (on one or more IC dies) that is designed to impart a certain logic or mixed signal (analog/digital) functionality to the electrical system. The FUB may be manufactured using an entirely CMOS process in which all of the active devices are FETs, or it may alternatively be manufactured using a Bipolar-MOS process in which other transistors in addition to FETs are also provided. In general, there is some flexibility in the physical placement of the CBG, LBGs, and FUBs. In most advanced CMOS ICs, however, all three components are most likely to be formed on the same IC die for lower cost and better performance.

The LBG 108 is designed to translate an input voltage received from the CBG 104 into a voltage that is applied to the bulk terminal of PFETs. The LBG 108 may range from a simple buffer or a fixed low impedance path (such as a wire) that duplicates the input voltage at its output, to much more complex signal conditioning circuitry that may include scaling and/or level shifting of the input into a desired level for a given FET. These more sophisticated types of LBGs may also be configured to operate with different supply voltages than the FUB 114. For instance, the CBG 104, the LBG 108, and the FUB 114 may all be operating under the same power supply voltage Vdd-Vss. Sometimes, however, the FUB and the LBG may be designed to operate at a different power supply voltage than the CBG. In such a case, the LBG may serve to translate between the power supply of the CBG 104 and that of the FUB 114, such that the correct FBB is provided to the desired FETs in the FUB.

According to one embodiment, the amplifier 118 and current mirror 121 are designed such that Vd2 is approximately equal to 0.4 volts when Vd1 is equal to a forward diode voltage of 0.7 volts. To obtain such a value for Vd2, the ratio of Im/I may be set to less than 1 in the current mirror 121. As an alternative to scaling using the current mirror 121, the LBG 108 may be provided with scaling and/or level shifting circuitry to adjust the FBB that is actually applied to the bulk terminal of the FETs in the FUB 114.

Figure 2:
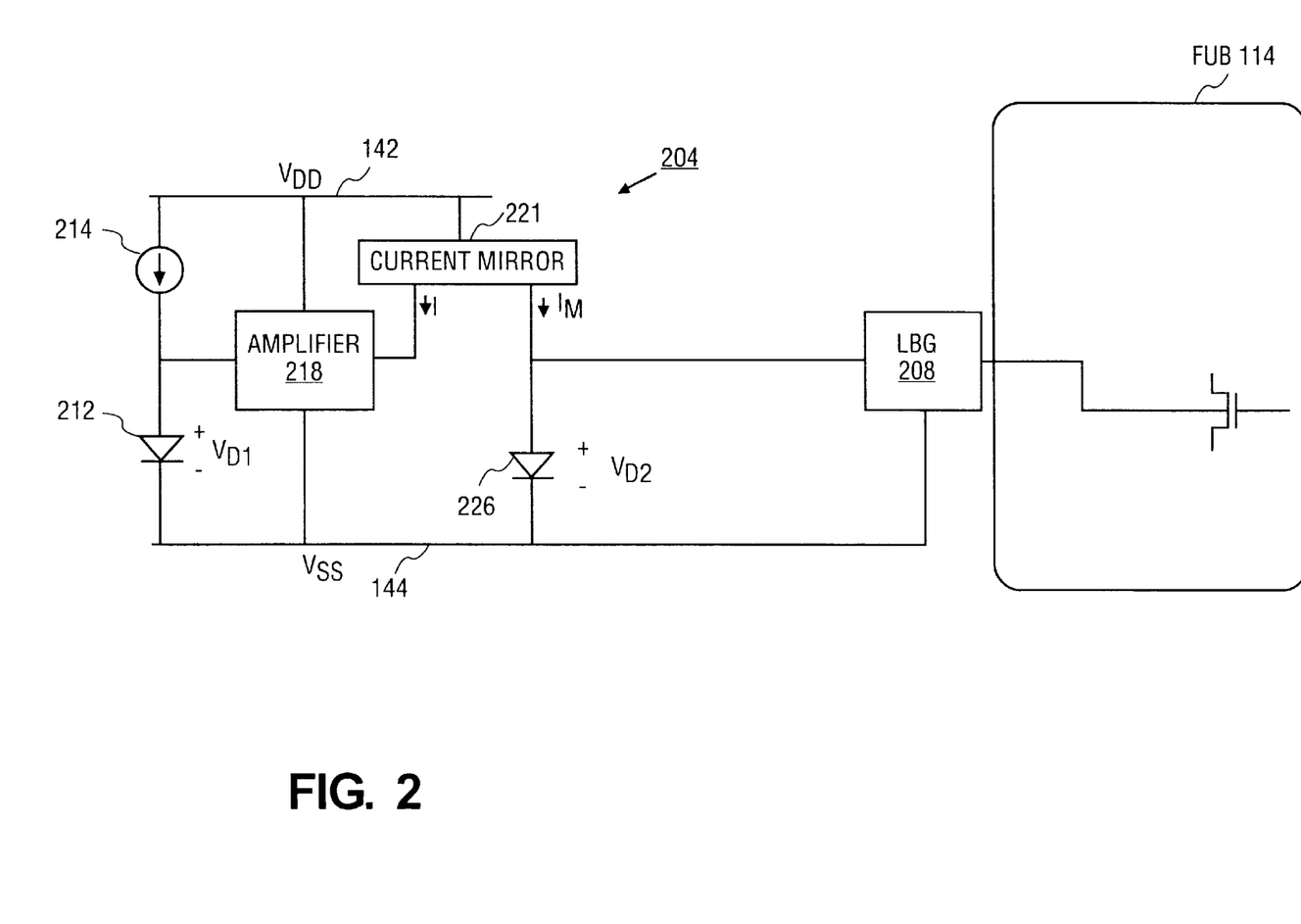
FIG. 2 shows a central bias generator according to another embodiment of the invention.

Referring now to FIG. 2, what's shown is a block diagram of a CBG 204 which is suitable for providing a FBB to the bulk of NFETs. An output voltage of the CBG 204 is Vd2 across a diode element 226 whose cathode is, in this embodiment, shorted to the return line 144 (Vss). An LBG 208 provides the constant FBB to the bulk of NFETs in the FUB 114, in response to the input second diode voltage Vd2. Similar to the LBG 108, the LBG 208 may be a simple fixed low imnpedance path such as a wire that merely duplicates Vd2 across the bulk-source terminals of the NFETs, or it may have signal conditioning circuitry including level shifting and/or scaling.

The CBG 204 may be viewed as a complement of the CBG 104 in which a current mirror 221 sources rather than sinks the mirrored current Im into the second diode element 226. An amplifier 218 also receives as its input the first diode voltage Vd1 which appears across a first diode element 212 and in response draws a current I through the current mirror 221. The diode element 212 is forward biased by a current source 214. The various alternatives that were described above in connection with CBG 104 also apply to CBG 204 shown in FIG. 2.

Figure 3:
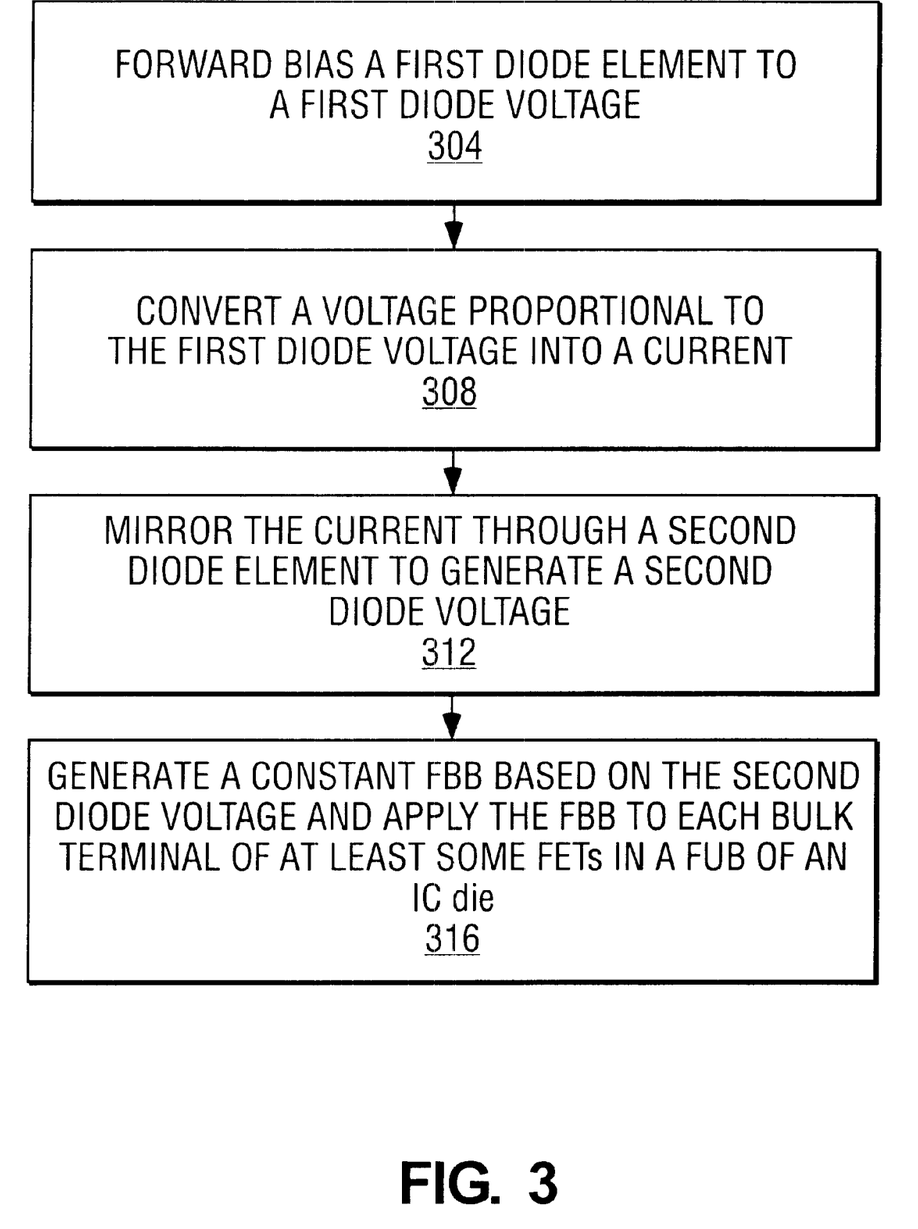
FIG. 3 illustrates a flow diagram of operations that are performed in generating a forward body bias, according to some embodiments of the invention.

Turning now to FIG. 3, a flow diagram of operations performed in a process for generating a constant FBB are shown. These operations may be Li, performed, for instance, using the electrical systems described above in FIGS. 1 and 2. Operation begins with the forward biasing of a first diode element to a first diode voltage (block 304). This biasing may be done using a current source/sink that, although may vary substantially, should not vary so much as to cause the resulting diode voltage to vary more than 15% else it would probably be unsuitable for forward body bias applications. A voltage proportional to this first diode voltage is converted into a current (block 308). This may be done using an amplifier that converts an input voltage into an output current. The current is then mirrored through a second diode element, to generate a second diode voltage (block 312). A constant FBB, based upon the second diode voltage, is then generated and applied to each bulk terminal of at least some FETs in a FUB of an IC die (block 316). In certain embodiments where the FETs that receive the FBB have their source terminals shorted to either the power supply or power return lines, it may be more efficient to have the conversion and mirroring operations of 308 and 312 be configured such that the second diode voltage is essentially equal to the desired FBB (e.g. 0.4 volts) so that the constant FBB that is generated is essentially equal to the second diode voltage. In such an embodiment, the LBG 108 or 208 may be a fixed low impedance path such as a wire, and the amplifier 118/218 and current mirror 121/221 are designed such that Vd2 is smaller than Vd1.

Figure 4:
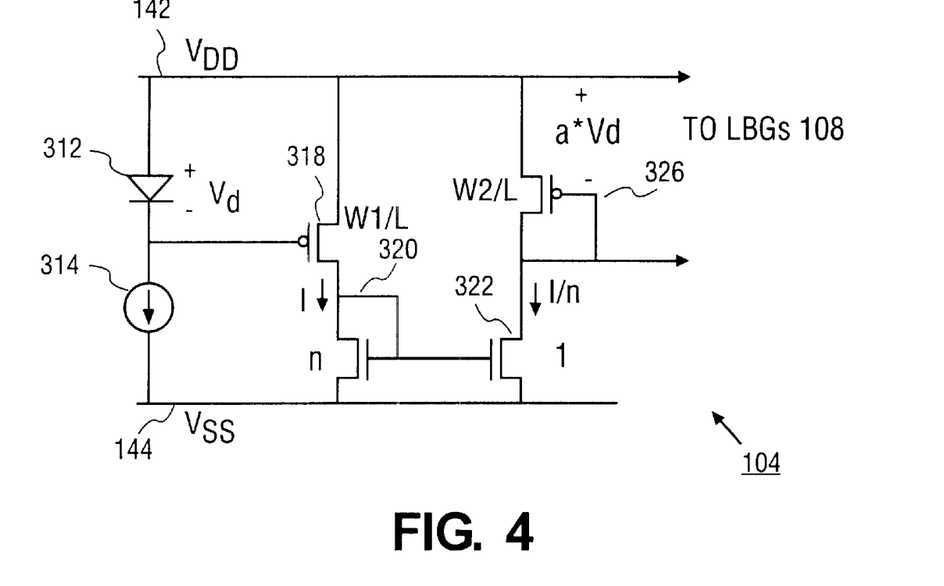
FIG. 4 depicts a circuit schematic of an embodiment of the central bias generator.
Figure 5:
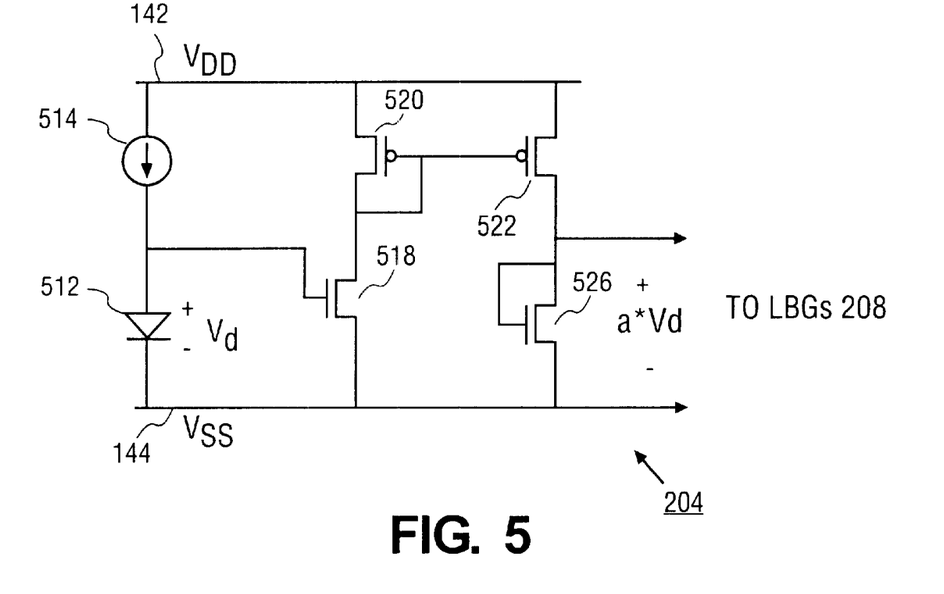
FIG. 5 depicts a circuit schematic of another embodiment of the central bias generator.

FIGS. 4 and 5 are circuit schematics of particular versions of the CBG 104 and 204, respectively. The CBG 104 in FIG. 4 is based on a first diode 312 and a current sink 314, whereas the CBG 204 in FIG. 5 is based on a first diode 512 and a current source 514. In both cases, the diode voltage is input to an amplifier that includes, for CBG 104, PFET 318 and for CBG 204, NFET 518. The PFET 318 and NFET 518 are said to be common source configured amplifiers whose inputs are at their respective gates and whose outputs are at their respective drains. A current mirror is made of NFETs 320 and 322 (corresponding to PFETs 520 and 522 in CBG 204). In these embodiments, the second diode element is a diode connected transistor, PFET 326 for CBG 104 and NFET 526 for CBG 204.

One of ordinary skill in the art may show through standard circuit analysis that when the FETs in CBG 104 are long channel devices, the following equation may be derived:

$$\sqrt{\frac{W1}{nW2}} = \frac{aVd - Vt}{Vd - Vt}$$

The ratio W1/W2 is the ratio of the size of the PFET 318 to that of PFET 326. N is the ratio of the output sink current to the input sink current of the current mirror formed by NFETs 320 and 322. Finally, Vt is the assumed threshold voltage of both PFETs 318 and 326 (although it is not necessarily true that the actual Vt for these two devices are equal). The equation thus gives a relationship between the size of the PFET 318 and the diode connected PFET 326 as well as the downscaling ability of the current mirror, to yield a downscaling factor a that should be selected to generate the correct FBB, a*Vd. In this connection, n may be a positive integer that represents the ratio of the size of NFET 320 to that of NFET 322. A similar relationship between the sizes of PFETs 520 and 522 and the NFET 518 and diode connected NFET 526 may be derived by those of ordinary skill in the art for CBG 204 shown in FIG. 5.

Figure 6:
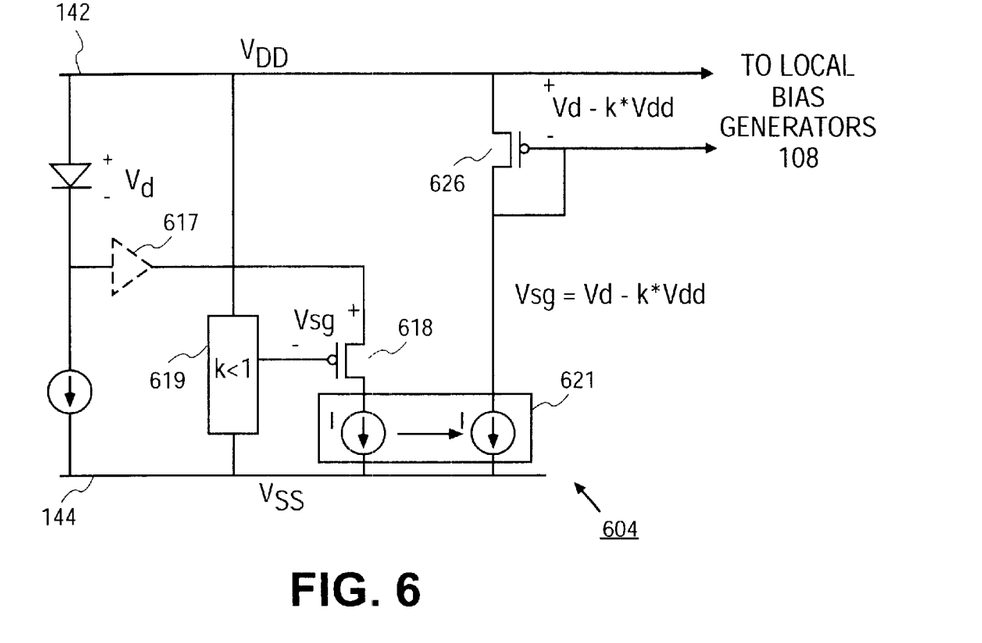
FIG. 6 shows a circuit schematic of a central bias generator that may be suitable for biasing PFETs.
Figure 7:
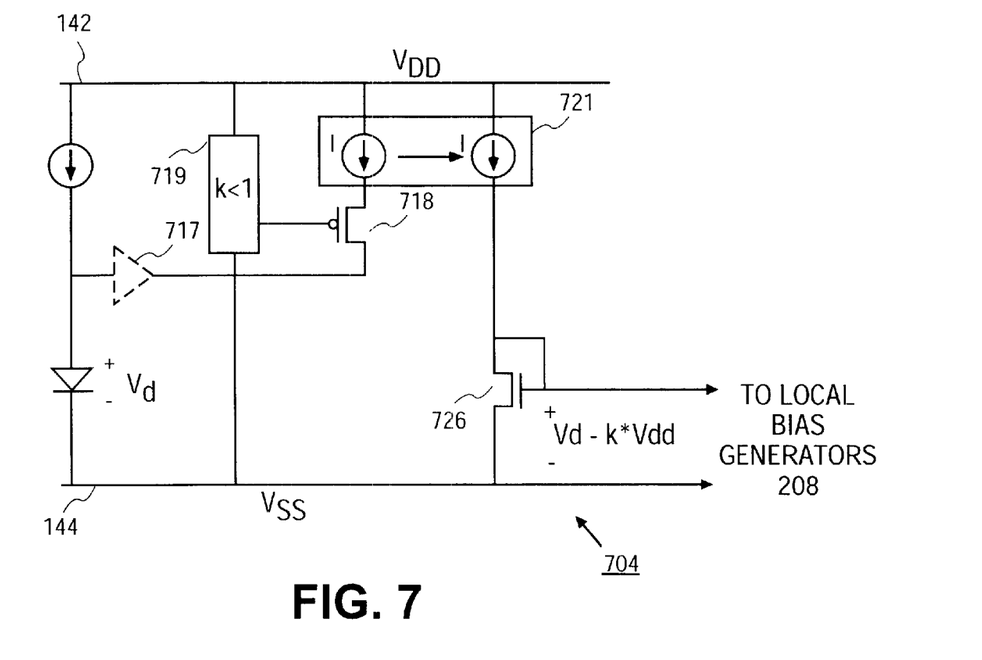
FIG. 7 depicts a circuit schematic of a central bias generator suitable for biasing NFETs.

FIGS. 6 and 7 depict block diagrams of CBG 604 and CBG 704, respectively, in which the voltage provided to the local bias generators 108 and 208 is a level shifted version of the first diode voltage Vd, rather than a downscaled version as in FIGS. 4 and 5. In these embodiments, the level shifting of the first diode voltage Vd is accomplished using a common gate configured FET 618/718 whose gate is biased at a fraction of the supply voltage measured between the supply line 142 and the return line 144. In the particular embodiments shown, a voltage divider 619/719 is provided which yields an output voltage of (1−k)*Vdd where k is a whole fraction less than 1. An output of the common gate configured FET 618/718 is coupled to source/sink current into or from a current mirror 621/721. Once again, the output of the current mirror is coupled to sink/source a current through the second diode element, which in this case is again a diode connected FET 626/726. The FET pairs 618/626 and 718/726 are matched, and the scaling factor of the current mirror is unity. One of ordinary skill in the art may derive the output voltage of the CBG 604/704 as being substantially equal to Vd−k*Vdd where k is as mentioned above, a whole fraction less than 1.

Some of the advantages of generating FBB using the different embodiments described above include the absence of complex and costly bandgap reference circuitry, the absence of external control signals needed to insure that the FBB remains basically constant, the ability of the circuitry particularly those shown in FIGS. 4–7 to work with low headroom, that is small supply voltages of 0.8 to 0.9 volts, low area overhead because of the relatively few circuit components involved, as well as reduced design complexity compared to prior art bandgap based forward body bias generation schemes. The circuits of FIGS. 6 and 7 provide a further desirable feature of automatically increasing the output voltage (and hence the FBB) as the supply voltage drops. This feature of automatically increasing the FBB as a function of decreased supply voltage is useful for maintaining the switching speed of digital circuits as the supply voltage is reduced, by a reduction in the threshold voltage Vt which results from the increased forward body bias.

To summarize, various embodiments of a technique for generating forward body bias using diode clamps have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, referring to the embodiments of FIGS. 6 and 7, the amplifier circuitry that features the voltage divider 619/719 and the common gate configured FET 618/718 may further include a high input impedance buffer 617/717 coupled between the first diode element and a drain of the common gate configured FET, to buffer the first diode voltage. This allows the actual diode voltage to be more accurately predicted during the circuit design process. The specification and drawings are, accordingly, to be regarded in an illustrative rather than a restrictive sense.

What is claimed is:

1. An electrical system comprising:
   a functional unit block (FUB) including field effect transistors (FETs), each FET having source, drain, gate and bulk terminals;
   a central bias generator having a first diode element, a current source/sink coupled in series with the first diode between a power supply line and a power return line to forward bias the first diode at a first diode voltage, an amplifier whose input is coupled to receive the first diode voltage and whose output is coupled to feed a current mirror, the current mirror is coupled to source/sink a mirrored current by a scaling factor less than 1 through a second diode element to generate a second diode voltage; and
   a plurality of local bias generators each being coupled to the second diode element to provide a respective constant forward body bias (FBB), in response to the second diode voltage, to a respective bulk terminal of at least some of the FETs.

2. The electrical system of claim 1 wherein the first and second diode elements are diode connected FETs.

3. The electrical system of claim 1 wherein the amplifier includes a common source configured FET.

4. The electrical system of claim 3 wherein the current mirror is to source/sink the mirrored current by a scaling factor such that the second diode voltage is approximately 0.4 Volts when the first diode voltage is approximately 0.7 Volts.

5. The electrical system of claim 1 wherein the current source/sink is a current sink and the current mirror is to sink the mirrored current.

6. The electrical system of claim 5 wherein the second diode element has one end shorted to the power supply line and another end from which the mirrored current is sunk.

7. The electrical system of claim 1 wherein each of the plurality of local bias generators shorts an output of the second diode element to the respective bulk terminal of at least some of the FETs.

8. The electrical system of claim 1 wherein each of the plurality of local bias generators is to provide the respective constant FBB by using a respective voltage level shift circuit to level shift the second diode voltage.

9. The electrical system of claim 1 wherein the amplifier includes a common gate configured FET whose gate is coupled to be biased at a fraction of a supply voltage measured between the supply and return lines.

10. The electrical system of claim 9 wherein the amplifier further includes a high input impedance buffer coupled between the first diode element and a source/drain of the common gate configured FET, to buffer the first diode voltage.

11. A method for providing forward body bias (FBB), comprising:
   forward biasing a first diode element to a first diode voltage;
   converting a voltage proportional to the first diode voltage into a current;
   mirroring the current through a second diode element by a scaling factor less than one to generate a second diode voltage; and
   generating a constant FBB based upon the second diode voltage and applying the constant FBB to a bulk terminal of a field effect transistor (FET) of a first conductivity type in a functional unit block (FUB) of an integrated circuit die.

12. The method of claim 11 wherein the conversion causes the second diode voltage to be a downscaled version of the first diode voltage.

13. The method of claim 12 wherein the current is mirrored by a scaling factor such that the second diode voltage is approximately 0.4 Volts when the first diode voltage is approximately 0.7 Volts.

14. The method of claim 11 wherein the conversion causes the second diode voltage to be a level shifted version of the first diode voltage.

15. The method of claim 11 wherein the mirrored current is sunk through the second diode element.

16. The method of claim 11 wherein the generating and applying the constant FBB includes applying the second diode voltage directly to the bulk terminal of the FET.

17. An electrical system comprising:

means for generating a first diode voltage;

means for converting a voltage proportional to the first diode voltage into a current;

means for generating a second diode voltage in response to the current including means for mirroring the current by a scaling factor less than 1; and means for generating a constant forward body bias (FBB) based upon the second diode voltage and applying the constant FBB to a bulk terminal of a field effect transistor (FET) of a first conductivity type in a functional unit block (FUB) of an integrated circuit die.

18. The electrical system of claim 17 wherein the conversion means causes the second diode voltage to be a downscaled version of the first diode voltage.

19. The electrical system of claim 17 wherein the conversion means causes the second diode voltage to be a level shifted version of the first diode voltage.

20. The electrical system of claim 17 wherein the FBB generation and application means includes means for directly applying the second diode voltage to the bulk terminal of the field effect transistor.

21. An electrical system comprising:

a functional unit block including field effect transistors (FETs), each FET having source, drain, gate, and bulk regions;

a first bias circuit having a first diode element, a current source/sink coupled in series with the first diode element to forward bias the first diode element at a first diode voltage, an amplifier with an input coupled to receive the first diode voltage and an output coupled to feed a current mirror, wherein the amplifier includes a common gate configured FET whose gate is coupled to be biased at a fraction of a supply voltage, the current mirror being coupled to source/sink a mirrored current through a second diode element to generate a second diode voltage; and a plurality of second bias circuits each being coupled to the second diode element to provide a respective forward body bias (FBB), in response to the second diode voltage, to a respective bulk region of at least some of the FETs.

22. The electrical system of claim 21 wherein the amplifier further includes a high input impedance buffer coupled between the first diode element and a source/drain of the common gate configured FET, to buffer the first diode voltage.

23. The electrical system of claim 21 wherein the current mirror has a scaling factor of one.

24. The electrical system of claim 23 wherein the common gate configured FET is biased such that the second diode voltage is approximately 0.4 volts when the first diode voltage is 0.7 volts.

25. The electrical system of claim 21 wherein each of the second bias circuits shorts an output of the second diode element to the respective bulk terminal of at least some of the FETs.

26. An electrical system comprising:

a functional unit block including a plurality of field effect transistors (FETs), each FET having source, drain, gate and bulk terminals;

a first bias circuit having a first diode element, a current source/sink coupled in series with the first diode element to forward bias the first diode element at a first voltage measured across the first diode element, an amplifier whose input is coupled to receive the first voltage and whose output is coupled to feed a current mirror, the current mirror being coupled to source/sink a mirrored current through a single, second diode element to generate a second voltage across the second diode element, wherein the first and second diode elements, the current mirror, and the amplifier are made of FETs which are coupled to receive no forward body bias; and a plurality of second bias circuits each being coupled to the second diode element to provide a forward body bias to a respective bulk terminal of at least some of the FETs in the functional unit block.

27. The electrical system of claim 26 wherein the amplifier includes a common source configured FET.

28. The electrical system of claim 27 wherein the current mirror is to source/sink the mirrored current by a scaling factor less than one.

29. The electrical system of claim 28 wherein the second diode element is a diode-connected p-channel FET and has one end shorted to a power supply line and another end from which the mirrored current is sunk.

30. The electrical system of claim 26 wherein the amplifier includes a common gate configured FET whose gate is coupled to be biased at a fraction of a supply voltage measured between a supply line and a return line, and wherein the current source/sink is coupled in series with the first diode element between the supply and return lines.

31. The system of claim 30 wherein the current mirror is to source/sink the mirrored current by a scaling factor of one.

32. The system of claim 31 wherein the common gate configured FET is biased such that the second voltage is approximately 0.4 Volts when the first voltage is 0.7 Volts.

* * * * *

UNITED STATES PATENT AND TRADEMARK OFFICE
CERTIFICATE OF CORRECTION

PATENT NO. : 6,469,572 B1
DATED : October 22, 2002
INVENTOR(S) : Bruneau et al.

It is certified that error appears in the above-identified patent and that said Letters Patent is hereby corrected as shown below:

Column 3,
Line 57, delete "imnpedance", insert -- impedance --.

Column 4,
Line 6, after "may be", delete -- Li, --.

Signed and Sealed this

Twenty-fifth Day of March, 2003

JAMES E. ROGAN
*Director of the United States Patent and Trademark Office*